US 6,744,256 B2

(12) United States Patent
Parker et al.

(10) Patent No.: US 6,744,256 B2
(45) Date of Patent: Jun. 1, 2004

(54) BOUNDARY-SCAN TESTING OF OPTO-ELECTRONIC DEVICES

(75) Inventors: Kenneth Paul Parker, Fort Collins, CO (US); Myunghee Lee, San Jose, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 247 days.

(21) Appl. No.: 10/021,180

(22) Filed: Oct. 29, 2001

(65) Prior Publication Data

US 2003/0080750 A1 May 1, 2003

(51) Int. Cl.[7] .................. H01H 31/02; G01R 31/08; G01R 31/02; G01R 31/26
(52) U.S. Cl. .................. 324/537; 324/765; 324/763; 324/527; 324/523; 324/522
(58) Field of Search .................. 324/537, 76.11, 324/522, 523, 527, 763, 765; 714/727

(56) References Cited

U.S. PATENT DOCUMENTS

| | | | | |
|---|---|---|---|---|
| 5,313,470 A | * | 5/1994 | Simpson | 714/727 |
| 5,444,716 A | * | 8/1995 | Jarwala et al. | 714/727 |
| 5,872,796 A | | 2/1999 | Golshan et al. | 371/22.32 |
| 6,239,888 B1 | * | 5/2001 | Willebrand | 398/129 |
| 6,243,665 B1 | * | 6/2001 | Nagoya et al. | 703/20 |
| 6,297,643 B2 | * | 10/2001 | De Jong et al. | 324/537 |

OTHER PUBLICATIONS

"The Boundary Scan Cell", Texas Instruments, JTAG IEEE 1149. 1/P1149.4 Tutorial, Tut. I–20 & Tut. 11–24–26 (Sep. 1997).
M.J.Y. Williams & J.B. Angell, "Enhancing Testability of Large–Scale Integrated Circuits Via Test Points and Additional Logic", IEEE Trans. on Computers, vol. C–22, No. 1, pp. 46–60 (Jan. 1973).
E.B. Eichelberger & T.W. Williams, "A Logic Design Structure for LSI Testability", Proc. 14th Design Automation Conf., IEEE Pub. 77CH1216–1C, pp. 462–468 (Jun. 1977).
T.W. Williams & K.P. Parker, "Design for Testability—A Survey", Proceedings of the IEEE, vol. 71, No. 1 (Jan. 1983).
J.D. Moorehead et al., "Testability Aspects of a DSP Based ImageProcessing System", IEE Colloquium 'Systems Design for Testability' (Digest No. 1995/083), London, UK, Apr. 26, 1995, pub. 1995, UK, IEE pp. 7/1–7/3.

* cited by examiner

Primary Examiner—N. Le
Assistant Examiner—John Teresinski

(57) ABSTRACT

Disclosed are methods and apparatus for testing opto-electronic devices. Test data is shifted into a first boundary-scan cell. A test is then launched from the first boundary-scan cell by outputting the shifted test data to a signal generator. The signal generator, in turn, provides conditioned test data to an opto-electronic transmitter, in response to the shifted test data and at least one constraint for operating the opto-electronic transmitter. Finally, a response to the test is captured.

25 Claims, 6 Drawing Sheets

BOUNDARY-SCAN TESTING OF OPTO-ELECTRONIC DEVICES

FIELD OF THE INVENTION

The invention pertains to circuit board test, and more specifically, to the test of circuit boards on which one or more opto-electronic devices are installed.

BACKGROUND OF THE INVENTION

Today's high-speed communication systems often comprise a mix of electrical and optical subsystems 100, 102 (FIG. 1). While electrical subsystems propagate signals via electrons, optical subsystems propagate signals via photons (i.e., light—denoted in the figures by the Greek lambda "λ" symbol). An interface comprising one or more opto-electronic devices 104 is therefore needed to convert electrical signals to optical signals and/or vice versa.

An opto-electronic (OE) device may assume one or both of two roles: that of transmitter 106 (i.e., a device which converts electrical signals to optical signals), or that of receiver 108 (i.e., a device which converts optical signals to electrical signals). In the case of an OE transmitter, electrical signals propagated over wires, cables and/or printed circuit board traces enter the electronic portion of the OE transmitter. The electrical signals are then converted to photonic signals that are output from the optical portion of the OE transmitter. The photonic signals propagate over fiber optic cables and/or through air. In the case of an OE receiver, photonic signals propagated over fiber optic cables and/or through air enter the optical portion of the OE receiver. The photonic signals are then converted to electrical signals that are output from the electrical portion of the OE receiver.

With respect to OE transmitters, the electronic portion of a transmitter will often implement monitor and controller functions that 1) maintain the quality of signals output from the optical portion of the transmitter, and 2) control safety factors relating to operation of the optical portion of the transmitter.

A common safety factor which is considered during operation of an OE transmitter is eye safety. The wavelengths of light emitted by an OE transmitter can be dangerous to the human eye, especially when viewed over extended periods (that is, extended periods with respect to the operation of the transmitter—such as a few milliseconds). Eye safety constraints can be respected, however, by using the electronic portion of an OE transmitter to monitor and control the steady-state power output of the transmitter's optical portion. Typically, when steady-state power cannot be controlled (e.g., due to a transmitter defect), or when total power output exceeds a defined threshold, then the electronic and/or optical portions of the transmitter automatically shut down and "lock out" the optical portion of the transmitter. Upon "lock out", the optical portion of the transmitter will only "unlock" (i.e., restart) upon receipt of a reset sequence from the electronic portion of the transmitter.

When OE devices are soldered to a printed circuit (PC) board, they present testing problems. For instance, consider an OE transmitter having an electronic portion soldered to a PC board, but having an optical portion that serves as a board output. In order to test such a transmitter, a tester, such as an Agilent 3070 Board Tester (manufactured by Agilent Technologies, Inc. of Palo Alto, Calif., USA), must not only be capable of stimulating the electrical inputs of the transmitter, but it must also be capable of capturing a photonic response from the transmitter. This is not a standard capability of board test equipment. In fact, even if a custom photonic receptor can be coupled to (or placed in the line of transmission of) a transmitter's photonic output, it can be difficult to devise a test that even generates a response to be captured. This is particularly so with respect to "in-circuit", "structural", or "scan" testing, wherein the design of test patterns which obey the stimulation rules of a transmitter's electrical inputs may be difficult. If stimulation rules are not obeyed, the afore-mentioned monitoring and control functions of a transmitter's electronic portion may cease to operate (resulting in potential eye hazards), or more likely, the monitoring and control functions will operate all too well, and the optical portion of a transmitter will be disabled. In the latter case, further tests of the transmitter are not possible until the transmitter is reset. Furthermore, if a good transmitter is inadvertently disabled, a tester may fail to realize this and merely identify the transmitter as failed without attempting a reset.

Resetting an OE transmitter is a problem unto itself. First, depending on which external inputs and/or internal nodes a tester is designed to stimulate, the launch of a reset sequence may not be possible. Second, assuming that the launch of a reset sequence is possible, the test pattern(s) which are needed to launch such a sequence may not be known, or may only be derived after significant effort. Finally, even in a best case scenario, where the launch of a reset sequence is possible, and the test pattern(s) for launching the reset sequence are known, the launch may consume a great number of test cycles.

Next, consider an OE receiver having an electrical portion soldered to a PC board, but having an optical portion that serves as a board input. In order to test such a receiver, a tester must not only be capable of capturing an electrical response from the receiver, but it must also be capable of providing a photonic input to the receiver. Again, this is not a standard capability of board test equipment. In fact, even if a custom photonic transmitter can be coupled to (or placed in front of) a receiver's photonic input, a tester may find it difficult to generate the type of photonic inputs that the OE receiver expects. This is especially so given that many testers are unable to provide test patterns "at speed" for an electronic device, and OE devices typically operate at even higher speeds.

Finally, consider the case of an OE pair (i.e., an OE transmitter that is optically coupled to an OE receiver). In such a case, a tester no longer needs to transmit or receive photons. However, a tester is still charged with understanding, producing and monitoring the electronic protocols at either end of the pair.

SUMMARY OF THE INVENTION

The inventors have devised new methods and apparatus pertaining to boundary-scan testing of opto-electronic devices.

On the transmit side, an exemplary system may comprise an opto-electronic transmitter and a boundary-scan cell. The opto-electronic transmitter comprises an electrical input and an optical output. The boundary-scan cell comprises a signal generator. The signal generator, in turn, comprises an input, an output, and some logic. The signal generator input is coupled to receive test data that is shifted into the boundary-scan cell, and the signal generator output is coupled to provide conditioned test data to the electrical input of the opto-electronic transmitter. The logic is coupled between the signal generator's input and output and serves to generate the afore-mentioned "conditioned test data" in conformance with 1) the shifted test data, and 2) at least one constraint for operating the opto-electronic transmitter.

On the receiving side, an exemplary system may comprise an opto-electronic receiver and a boundary-scan cell. The opto-electronic receiver comprises an optical input and an electrical output. The boundary-scan cell comprises a signal detector. The signal detector, in turn, comprises an input, an output, and some logic. The signal detector input is coupled to receive a response from the electrical output of the opto-electronic receiver, and the signal detector output is coupled to provide an evaluated response to the shift register element. The logic is coupled between the signal detector's input and output and serves to generate the afore-mentioned "evaluated response" after monitoring the signal detector input over a period of time.

Finally, a method for testing opto-electronic devices may comprise 1) shifting test data into a first boundary-scan cell, 2) launching a test from the first boundary-scan cell by outputting the shifted test data to a signal generator, and 3) capturing a response to the test. The signal generator provides conditioned test data to an opto-electronic transmitter, in response to the shifted test data and at least one constraint for operating the opto-electronic transmitter.

BRIEF DESCRIPTION OF THE DRAWINGS

Illustrative and presently preferred embodiments of the invention are illustrated in the drawings, in which.

DESCRIPTION OF THE PREFERRED EMBODIMENT

There are two common forms of test that are used to verify circuit boards: functional test and structural test. Whereas functional tests verify that a circuit board as a whole operates as designed, structural tests verify that the components of a circuit board are correctly soldered and operational.

Structural testing became of interest in the mid-1970's, and is discussed in detail in the paper of M. J. Y. Williams and J. B. Angell entitled "Enhancing Testability of Large-Scale Integrated Circuits Via Test Points and Additional Logic", *IEEE Trans. on Computers*, vol. C-22, no. 1, pp. 46–60 (January 1973), and in the paper of E. B. Eichelberger and T. W. Williams entitled "A Logic Design Structure for LSI Testability", *Proc. 14$^{th}$ Design Automation Conf*, IEEE Pub. 77CH1216-1C, pp. 462–468 (June 1977). Initially called "scan" testing, structural testing enables the testing of structures which are deeply embedded within an integrated circuit (IC). Rather than testing the IC's internal structure by applying stimulus to the IC's inputs (as would be done in "functional" testing), structural testing involves shifting a series of test vectors into the core of an IC, and after each test vector is shifted in, launching the test vector and capturing a response. Each response is then shifted out of the IC. In this manner, a tester can verify that all of an IC's elements are present and operational. An assumption of structural testing is that if all elements are present and operational, then the elements will contribute to performing the greater and intended functions of the IC (e.g., adding, shifting, etc.), and the IC will function as designed.

Figure 1:
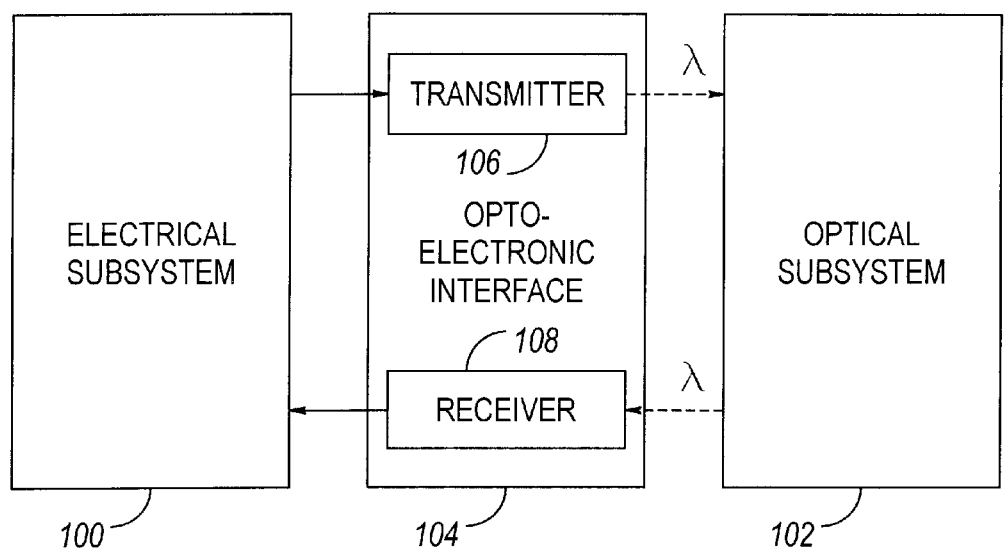
FIG. 1 illustrates electrical and optical subsystems coupled via an opto-electronic interface.
Figure 2:
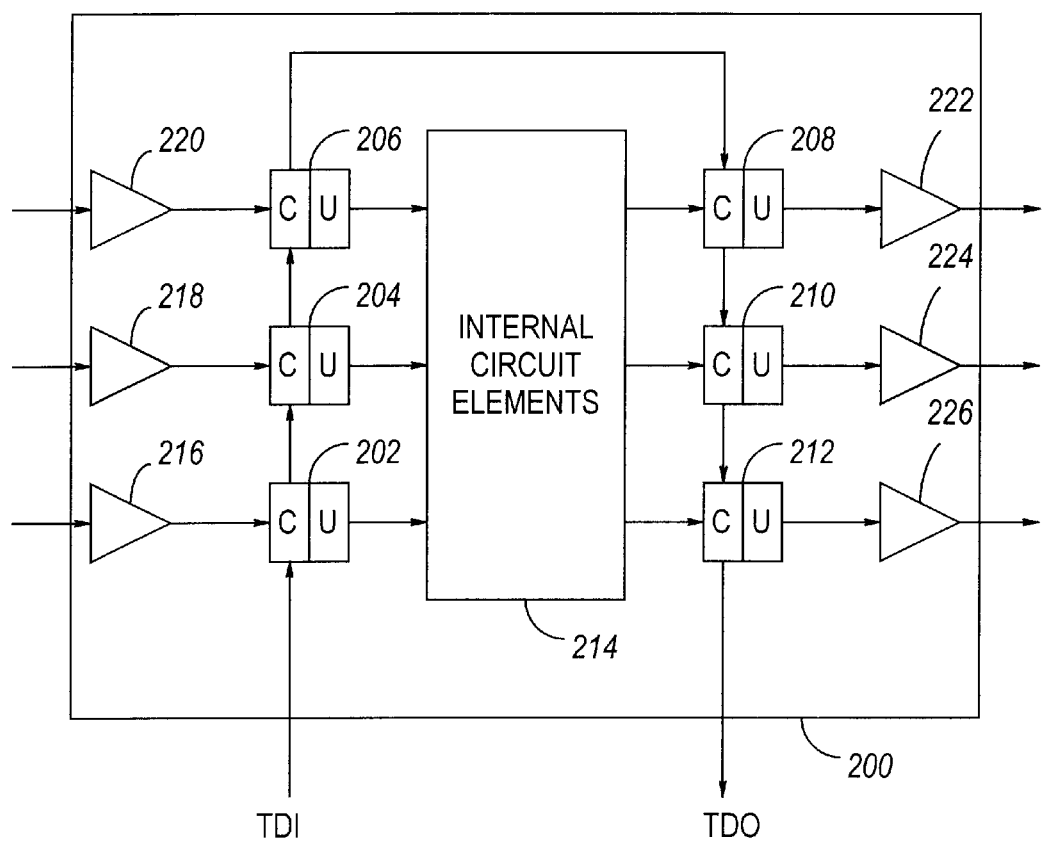
FIG. 2 illustrates an integrated circuit incorporating a scan chain.

FIG. 2 illustrates a conventional IC 200 incorporating a scan chain 202–212 for the purpose of structural testing. An IC 200 which is designed for structural testing is commonly referred to as being "designed for test", and therefore incorporates "design for test" (DFT) structures 202–212. The basic rules (i.e., DFT rules) for enabling structural testing of an IC 200 are:

1. Implement the IC 200 using synchronous clocked design (no asynchronous feedback).
2. In place of each register element (e.g., flip-flops) in the IC 200, insert a more complicated register element (i.e., a scan chain cell 202–212) having two modes of operation:
   a. A "normal mode" where the element works as a clocked memory element as required for the functionality of the IC 200; and
   b. A "test mode" where the element behaves as a member of a scan chain (i.e., a serial shift register chain).
3. Link the scan chain cells 202–212 to form a scan chain and route appropriate signals (e.g., mode, shift and data I/O signals) to each of the cells.

If desired, structural testing can be expanded to the board level. When designing a board, a designer can link signals of each IC at the board level (e.g., mode, shift and data I/O signals) to thereby expand structural testing to the board test level.

A detailed discussion of various scan chains may be found in the paper of T. W. Williams and K. P. Parker entitled "Design for Testability—A Survey", *Proceedings of the IEEE*, vol. 71, no. 1 (January 1983).

A well-known DFT strategy in the electronics industry is defined by IEEE Standard 1149.1. The latest version of this standard is entitled "IEEE Standard Test Access Port and Boundary-Scan Architecture", IEEE Std. 1149.1, which is hereby incorporated by reference for all that it discloses. IEEE Std. 1149.1 provides for various modes of boundary-scan operation. One common mode is INTEST, in which the internal elements 214 of an IC 200 are tested by launching a test vector into the core of the IC 200, and then capturing a response from the IC's core. Another common mode is EXTEST, in which the I/O 216–226 of an IC 200, and/or the connections between ICs, are tested. During EXTEST, a test vector is launched from the output boundary-scan cells 208–212 of a first IC 200, and a response is captured by the input boundary-scan cells of a second IC (e.g., input cells 216–220 similar to those of the IC 200 illustrated in FIG. 2). In this manner, a tester can test: the output drivers 222–226 of the first IC 200, the input drivers of the second IC, and the interconnections between the first and second ICs.

A shortcoming of IEEE Std. 1149.1, including EXTEST, is that it presumes a circuit's use of electronic I/O rather than opto-electronic (OE) I/O. As a result, EXTEST is not used to test OE devices. Unfortunately, simple manufacturing defects, such as solder opens and shorts, are very difficult to find absent the implementation and use of DFT structures and structural testing. In the face of no DFT, much more expensive functional testing (e.g., optical power measurements or Bit Error Rate Tests) must be used to test for these defects. Yet, even after these expensive functional tests, one only knows that "there is a defect somewhere". If structural tests such as EXTEST and/or other boundary-scan tests could be used to test OE devices, simple manufacturing defects could be located more quickly, cheaply, and automatically, and often with pinpoint diagnostics.

Figure 3:
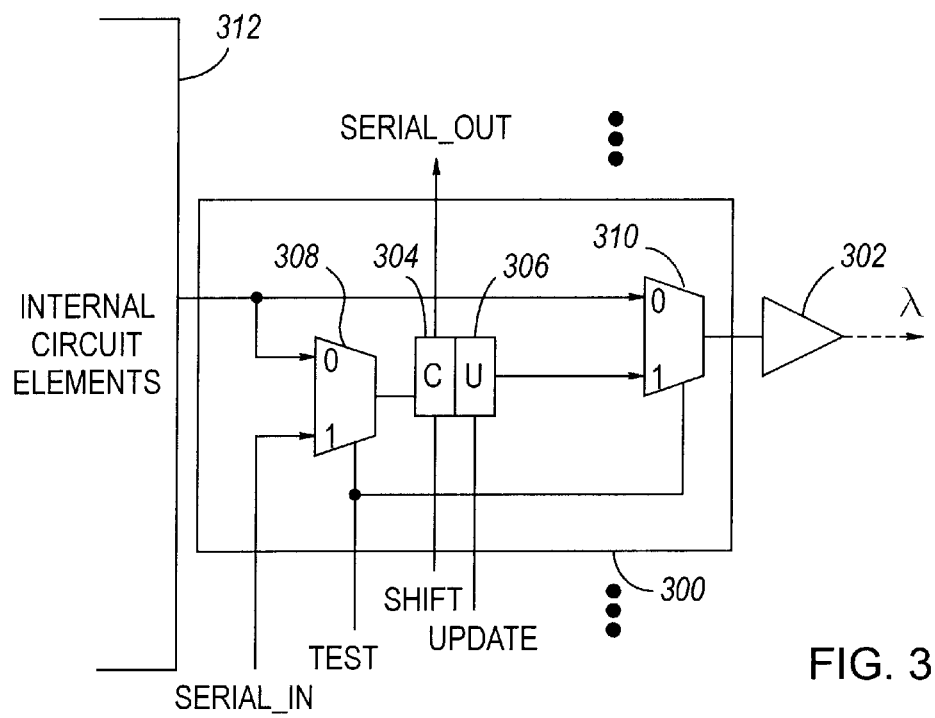
FIG. 3 illustrates a first implementation of a boundary-scan cell coupled to an opto-electronic transmitter.

FIG. 3 illustrates the simplest way in which an IEEE 1149.1 boundary-scan cell 300 could be used to control an OE transmitter 302 (e.g., a laser diode). By way of example, the boundary-scan cell 300 is shown to comprise series connected capture "C" and update "U" flip-flops 304, 306, as well as input and output multiplexers 308, 310. The flip-flops 304, 306 may be configured to operate in various ways. However, in one way, the boundary-scan cell 300 receives a TEST signal for controlling which of two boundary-scan cell 300 modes is active. In normal mode (TEST=0), data derived from an internal circuit node 312 may pass through the input multiplexer 308 and be captured by the capture flip-flop 304. The same data also passes through the output multiplexer 310 to reach the OE transmitter 302. In test mode (TEST=1), test data may be shifted between a SERIAL_IN input and SERIAL_OUT output in sync with a SHIFT clock. In this manner, test data may be shifted from one boundary-scan cell to another for the purpose of shifting test data into and/or out of an IC. Also while in test mode, an assertion of the UPDATE signal allows test data to be launched through the output multiplexer 310 to the OE transmitter 302. The signals TEST, SHIFT and UPDATE will be referred to herein as test control signals. Note that these signals are only exemplary test control signals, and the actual number and type of test control signals can vary, depending upon the type of boundary-scan cell 300 being implemented.

The boundary-scan cell 300 is coupled to the electrical input of the OE transmitter 302 via a multiplexer 310. The same multiplexer 310 has a second input which is coupled directly to the internal circuit node 312 from which the boundary-scan cell 300 derives its data (i.e., from which the boundary-scan cell 300 captures its response to a test). During an EXTEST cycle, the multiplexer 310 outputs data which has been shifted into the boundary-scan cell, and during normal operation of an IC, the multiplexer 310 outputs data received from an internal circuit node 312. In either case, data output from the multiplexer 310 is 1) received by the electronic portion of the OE transmitter 302, 2) converted to a photonic signal (i.e., light—denoted in the figures by the Greek lambda "λ" symbol), and then 3) output from the optical portion of the OE transmitter 302.

A problem with the FIG. 3 configuration is that the boundary-scan cell 300 is unable to monitor and control the safety features of the OE transmitter 302. Thus, when the boundary-scan cell 300 outputs a logic high, the transmitter 302 turns ON (and emits light) until a new test is loaded into and launched from the boundary-scan cell 300. Since boundary-scan registers may comprise dozens, hundreds, or even thousands of cells, the OE transmitter 302 could remain ON for a long time, resulting in one of two negative outcomes. If the tester inadvertently (or purposefully) disables the monitoring and control functions which disable the transmitter 302 when an operating constraint has been exceeded, then the transmitter 302 could produce excessive light, and the excessive light could result in an eye safety hazard for technicians working in the vicinity of the transmitter 302. Alternatively, if the afore-mentioned monitoring and control functions remain active during test, the transmitter 302 may be inadvertently disabled prior to the launch of the next test. In this latter case, the transmitter 302 may be flagged as failed when it is in fact good. Absent entering a functional test mode, which may involve connecting a circuit board to a different test fixture and/or different tester, it may be difficult to determine whether the transmitter 302 is in fact failed, or merely disabled. If the transmitter 302 is merely disabled, it may then be difficult to launch the appropriate reset sequence for enabling the transmitter 302 from within a test environment. As a result, the FIG. 3 implementation of boundary-scan principles would be problematic at best.

Next, consider the simplest way in which an IEEE 1149.1 boundary-scan cell 400 could be used to capture a response from an OE receiver 402 (e.g., a photo-detector such as a PIN diode (a diode having p-type and n-type semiconductor regions separated by an "intrinsic" region where photons can create electron-hole pairs); a metal-semiconductor-metal (MSM) diode; or an avalanche photo diode (APD)). See FIG. 4. By way of example, the boundary-scan cell 400 may be configured similarly to the boundary-scan cell 300 shown in FIG. 3.

The boundary-scan cell's capture flip-flop 404 is coupled to the electrical output of the OE receiver 402 via an input multiplexer 408, and the cell's update flip-flop 406 is coupled to one input of an output multiplexer 410. The other input of the output multiplexer 410 is coupled directly to the OE receiver's electrical output. During an INTEST cycle, the multiplexer 410 outputs data received from the boundary-scan cell 400; and during normal operation of an IC, the multiplexer 410 outputs data received from the OE receiver 402.

Figure 4:
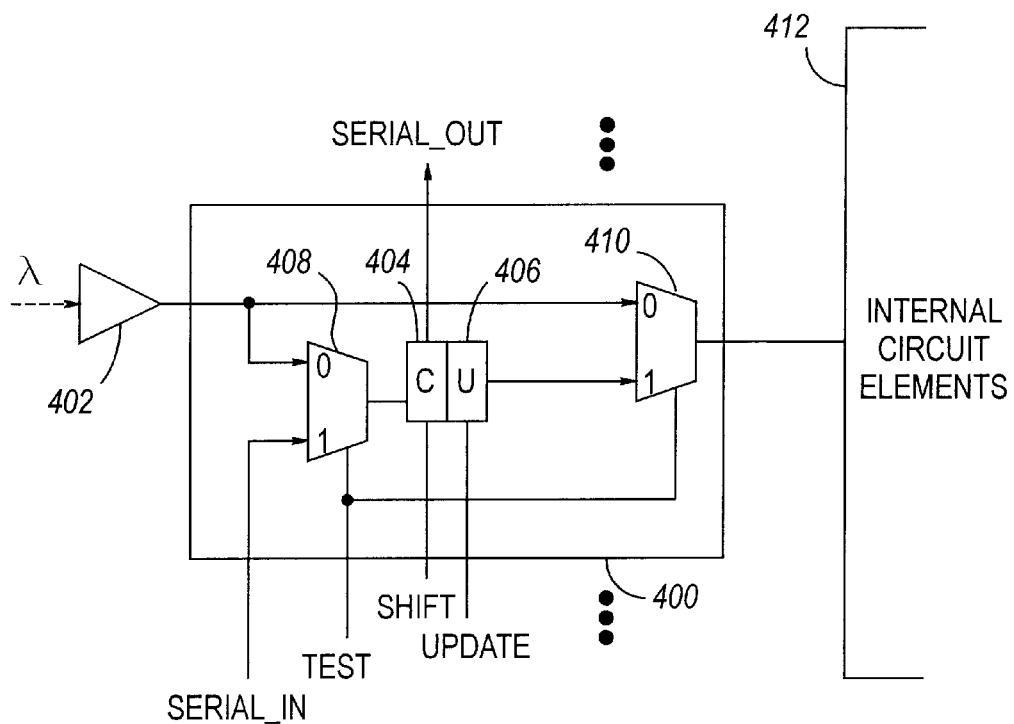
FIG. 4 illustrates a first implementation of a boundary-scan cell coupled to an opto-electronic receiver.

A problem with the FIG. 4 configuration is that signals received by the OE receiver 402 are likely to be in the form of a pulse or pulses (largely due to the afore-mentioned operating constraints of OE transmitters relating to steady-state power output, etc.). As a result, it is difficult to time the capture of a signal. If the boundary-scan cell 400 attempts a data capture too early or too late, a logic high output from the OE receiver 402 will not be captured, and the receiver 402 will be flagged as failed when it is in fact good. Likewise, if the capture cycle is too long, and the boundary-scan cell 400 uses a capture flip-flop 404, then the flip-flop 404 could be set and cleared during the same capture cycle. As a result, the FIG. 4 implementation of boundary-scan principles would also be problematic.

Figure 5:
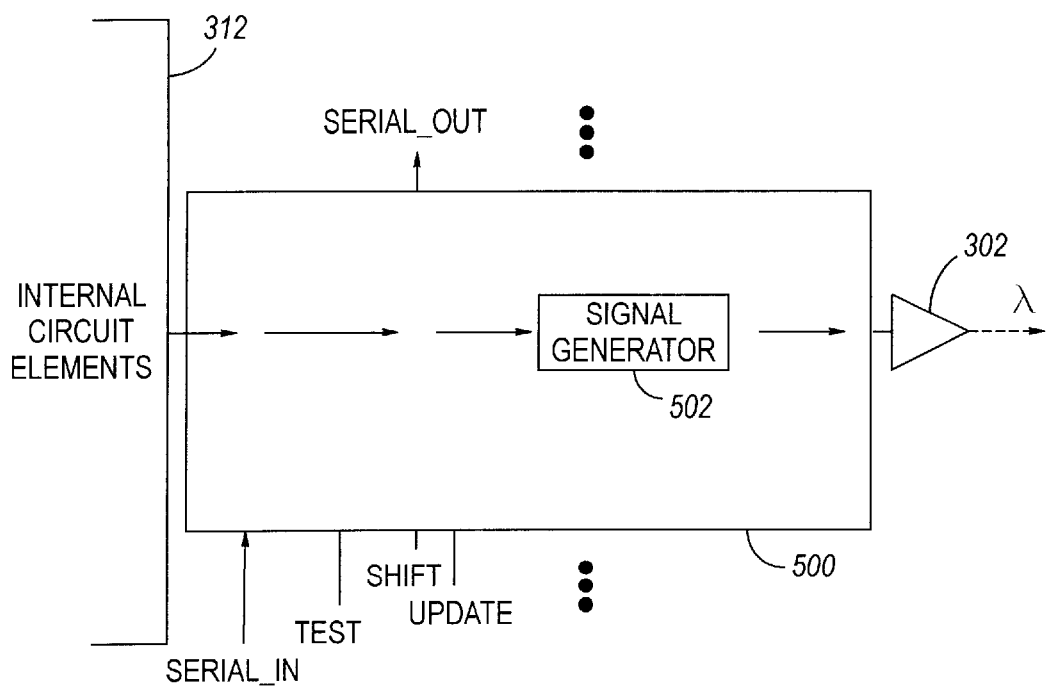
FIG. 5 illustrates a second implementation of a boundary-scan cell coupled to an opto-electronic transmitter.
Figure 10:
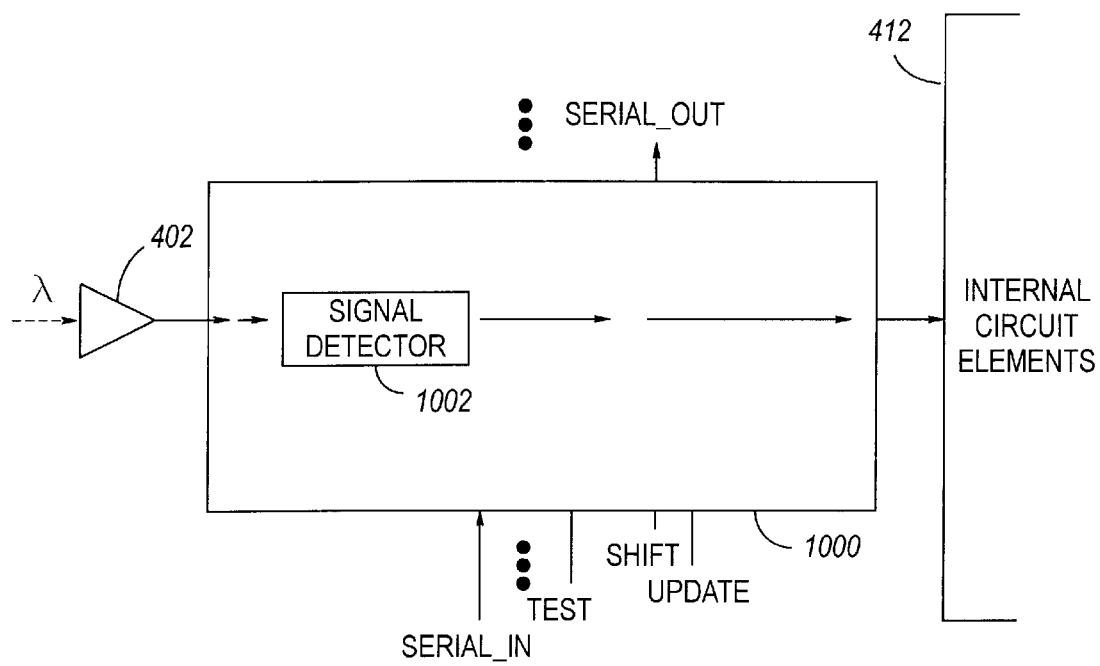
FIG. 10 illustrates a second implementation of a boundary-scan cell coupled to an opto-electronic receiver.

Boundary-scan implementations which are more effective for testing OE devices 302, 402 are illustrated in FIGS. 5 & 10.

FIG. 5 illustrates a system comprising an opto-electronic transmitter 302 and a boundary-scan cell 500. The opto-electronic transmitter 302 comprises an electrical input and an optical output. The boundary-scan cell 500 comprises a signal generator 502. The signal generator 502, in turn, comprises an input, an output, and some logic. The signal generator input is coupled to receive test data that is shifted into the boundary-scan cell 500, and the signal generator output is coupled to provide conditioned test data to the electrical input of the opto-electronic transmitter 302. The logic is coupled between the signal generator's input and output and serves to generate the afore-mentioned "conditioned test data" in conformance with 1) the shifted test data, and 2) at least one constraint for operating the opto-electronic transmitter.

The boundary-scan cell 500 illustrated in FIG. 5 may be variously configured. For example, the boundary-scan cell 500 may be generally configured as a capture/update cell having an output that "ripples", a capture/update cell having a latched output, an update-only cell, etc.

Figure 6:
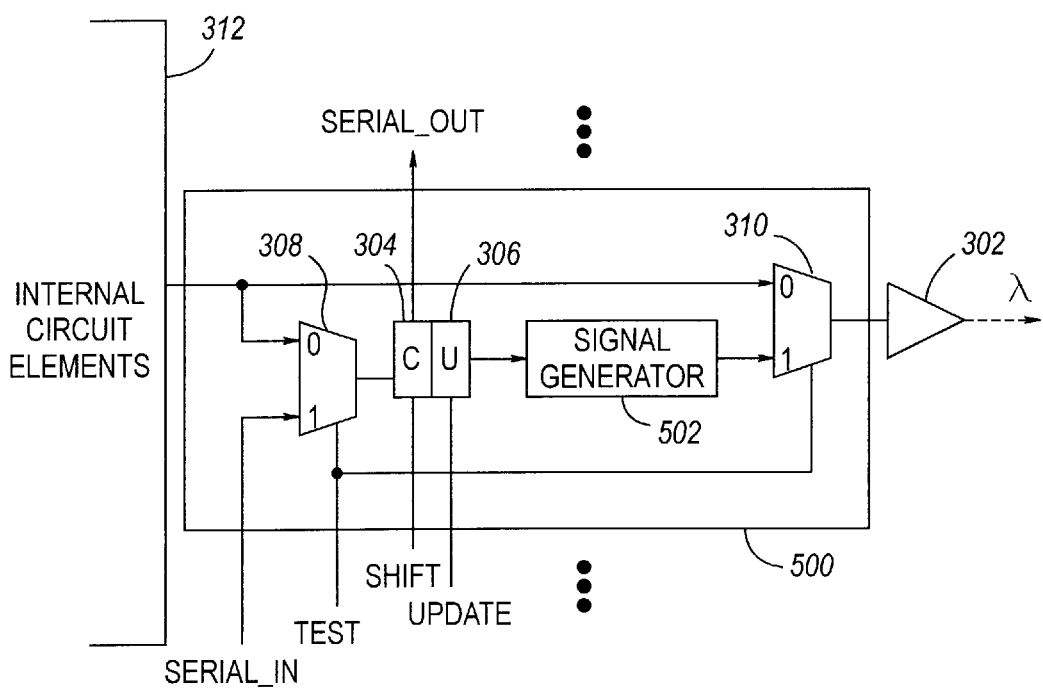
FIG. 6 illustrates a preferred embodiment of the FIG. 5 circuitry.

By way of example, FIG. 6 illustrates a system wherein the FIG. 5 boundary-scan cell 500 has been configured as a capture/update cell having a latched output. The boundary-scan cell 500 is similar to that which is illustrated in FIG. 3, in that it comprises series connected capture "C" and update "U" flip-flops 304, 306, as well as a pair of multiplexers 308, 310. The flip-flops 304, 306 and multiplexers 308, 310 function similarly to those shown in FIG. 3, and receive (and are controlled by) a number of test control signals (e.g., TEST, SHIFT, and UPDATE). In a preferred embodiment, the test control signals are IEEE Standard 1149.1 boundary-scan signals.

The FIG. 6 signal generator 502 is coupled between the boundary-scan cell's update flip-flop 306 and output multiplexer 310. Test data which is shifted into the cell's capture flip-flop 304 is eventually loaded into the cell's update flip-flop 306 and launched. Upon launch, the test data drives the signal generator's input. The signal generator's logic then responds to the test data by generating "conditioned test data". The conditioned test data is then output to an opto-electronic transmitter 302 via the cell's output multiplexer 310.

The signal generator logic may be variously implemented, depending upon the constraint(s) for operating the opto-electronic transmitter under which the logic operates. If the constraint(s) comprise an eye safety and/or steady-state power constraint, then the logic may comprise a waveform generator 700. In a preferred embodiment, the waveform generator 700 is configured to produce rectangular waveforms that cause the opto-electronic transmitter 302 to conform to the afore-mentioned eye safety and/or steady-state power constraints. For example, the waveform generator 700 may be configured to produce rectangular waveforms of a predetermined frequency, frequency range, time duration, and/or duty cycle such that the steady-state power of the opto-electronic transmitter 302 is maintained below a desired threshold.

Figure 8:
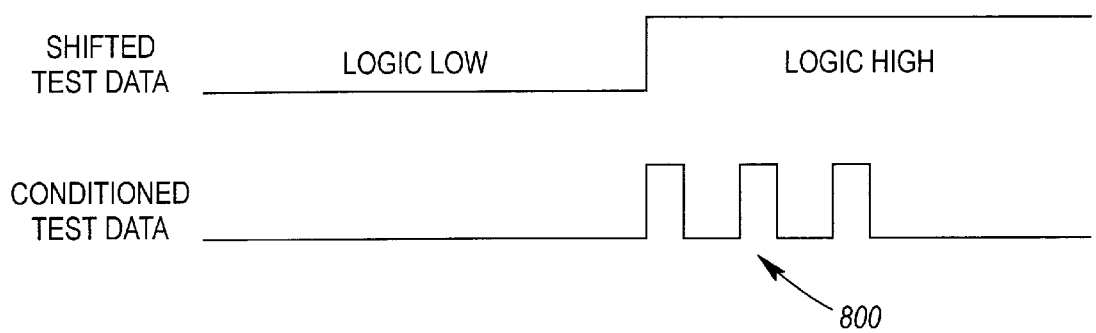
FIG. 8 illustrates a first number of waveforms that the FIG. 7 waveform generator might receive and generate.

The signal generator's logic produces conditioned test data not only in response to transmitter operating constraints, but also in response to the shifted test data which it receives. If the signal generator's logic comprises a waveform generator 700, then at least some of the conditioned test data output from the signal generator 602 should comprise patterned waveforms (e.g., rectangular waveforms). For example, shifted test data that assumes a first logic level (e.g., a logic high; see FIG. 8) might cause the waveform generator 700 to produce a stream of pulses 800 having a frequency and duty cycle which are dictated by the constraints for operating the opto-electronic transmitter 302. Likewise, shifted test data that assumes a second logic level (e.g., a logic low) might cause the waveform generator 700 to cease pulse generation (i.e., shifted test data which assumes the second logic level might disable the waveform generator).

Alternatively, shifted data that assumes a logic high might cause the waveform generator 700 to produce a stream of pulses 902 having a first set of characteristics (e.g., a first frequency, duration, and/or duty cycle dictated by the constraints for operating the opto-electronic transmitter 302). Shifted data that assumes a logic low might then cause the waveform generator 700 to produce a stream of pulses 900 having a second set of characteristics (e.g., a second frequency, duration, and/or duty cycle dictated by the constraints for operating the opto-electronic transmitter 302). In this latter case, a response captured from the opto-electronic transmitter 302 could be integrated and/or decoded to distinguish whether a logic high or logic low had been transmitted. If the transmitter 302 is forced to generate photons under all test conditions, one never risks missing an inadvertent disablement of the transmitter 302.

In another embodiment, the signal generator 502 might generate signals using an 8*b*–10*b* coding process, wherein a byte of test data is encoded in 10 bits of data. Such an encoding might be advantageous, for example, to distinguish the transmission of a "0" byte from a broken driver, etc.

As will be understood by those skilled in the art, the signal generator 502 might also implement other signal encoding schemes.

FIG. 10 illustrates a system comprising an opto-electronic receiver 402 and a boundary-scan cell 1000. The opto-electronic receiver 402 comprises an optical input and an electrical output. The boundary-scan cell 1000 comprises a signal detector 1002 and a shift register element 404. The signal detector 1002, in turn, comprises an input, an output, and some logic. The signal detector input is coupled to receive a response from the electrical output of the opto-electronic receiver 402, and the signal detector output is coupled to provide an evaluated response to the shift register element 404. The logic is coupled between the signal detectors input and output and serves to generate the afore-mentioned "evaluated response" after monitoring the signal detector input over a period of time.

The boundary-scan cell illustrated in FIG. 10 may be variously configured. For example, the boundary-scan cell 1000 may be generally configured as a capture/update cell having an output that "ripples", a capture/update cell having a latched output, an update-only cell, etc.

Figure 11:
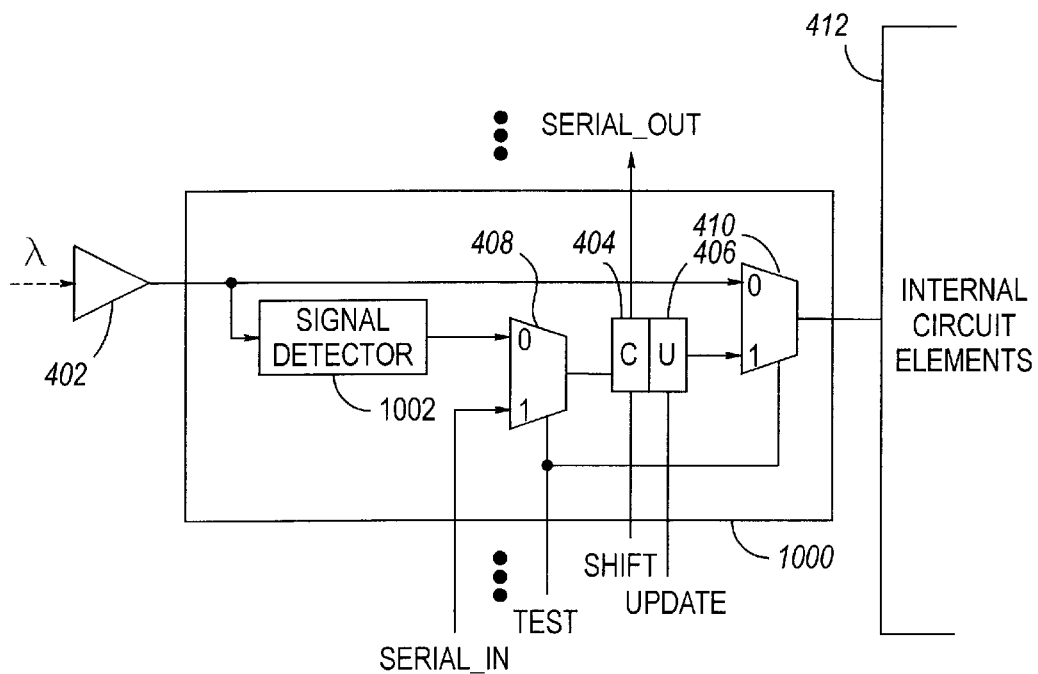
FIG. 11 illustrates a preferred embodiment of the FIG. 10 circuitry.

By way of example, FIG. 11 illustrates a system wherein the FIG. 10 boundary-scan cell 1000 is configured as a capture/update cell having a latched output. The boundary-scan cell 1000 is similar to that which is illustrated in FIG. 4, in that it comprises series connected capture "C" and update "U" flip-flops 404, 406, as well as a pair of multiplexers 408, 410. The flip-flops 404, 406 and multiplexers 408, 410 function similarly to those shown in FIG. 4, and receive (and are controlled by) a number of test control signals (e.g., TEST, SHIFT, and UPDATE). In a preferred embodiment, the test control signals are IEEE Standard 1149.1 boundary-scan signals.

The FIG. 11 signal detector 1002 is coupled between the opto-electronic receiver 402 and the boundary-scan cell's input multiplexer 408. The signal detector 1002 monitors the response(s) received at its input over a period of time, and then generates an "evaluated response". The evaluated response is then output to the cell's capture flip-flop 404 via the input multiplexer 408.

Figure 7:
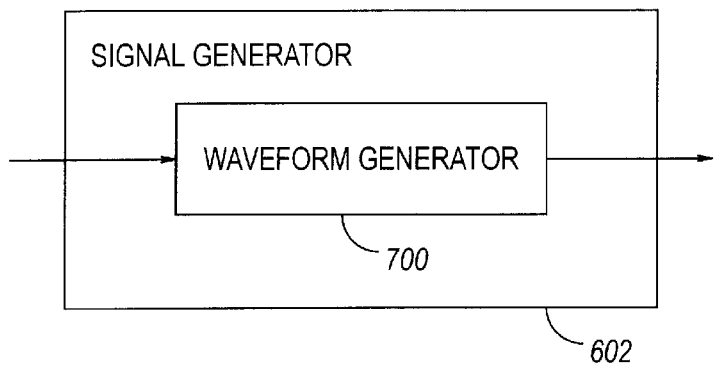
FIG. 7 illustrates a preferred embodiment of the signal generator shown in FIGS. 5 & 6.

The signal detector logic may be variously implemented, depending upon the type of response that is expected from the opto-electronic receiver 402. The type of response expected from the opto-electronic receiver 402 may depend, for example, on the type of signal generated by an opto-electronic transmitter 302 which is coupled to provide data to the opto-electronic receiver 402. The type of signal generated by an opto-electronic transmitter 302 may in turn depend on whether the transmitter 302 receives conditioned test data from a signal generator 502 like the one illustrated in FIGS. 5–7.

Figure 12:
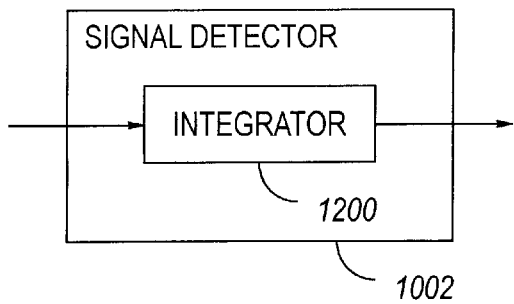
FIG. 12 illustrates a first preferred embodiment of the signal detector shown in FIGS. 10 & 11.
Figure 13:
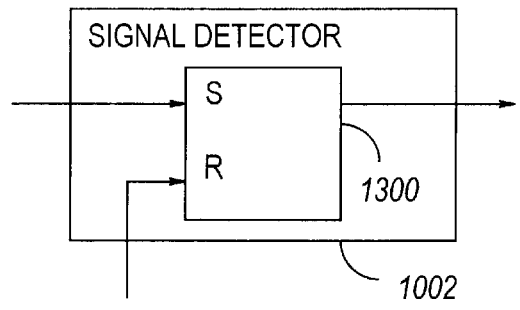
FIG. 13 illustrates a second preferred embodiment of the signal detector shown in FIGS. 10 & 11.

In one embodiment (FIG. 12), the signal detector logic may comprise an integrator 1200 for integrating a response which is received at the signal detector input over a period of time. The integrator 1200 may be configured, for example to 1) output a logic low when a response comprises a first series of pulses, and 2) output a logic high when a response comprises a second series of pulses. In this manner, the integrator 1200 may be used to distinguish two or more logic levels that are each encoded as a series of pulses (or waveform). The integrator 1200 could also be configured to 1) output a logic low when a response remains at a logic low throughout an integration period, and 2) output a logic high when a response comprises either a pulse or series of pulses.

In another embodiment, the signal detector logic may comprise a set-reset flip-flop 1300. The set-reset flip-flop 1300 may comprise a set (S) input coupled to the signal detector's input, and a reset (R) input coupled to receive at least one test control signal (e.g., the same UPDATE signal received by the boundary-scan cell 500 which drives a corresponding opto-electronic transmitter 302). In this manner, a response comprised of one or more pulses received at indeterminate points in time may be detected. The reset input serves as a clear input. Thus, at the beginning of a response period, the clear input can be asserted to reset the signal detector 1002.

The signal detector logic may further comprise other forms of decoders or the like, as will be appreciated by one skilled in the art (e.g., the signal detector logic could comprise an 8b–10b decoder).

It is envisioned that a plurality of the boundary-scan cells 500, 1000 illustrated in FIGS. 5 & 10 might be incorporated into a single IC and/or PC board. In this manner, a plurality of like or different opto-electronic devices, as well as a plurality of like or different opto-electronic interfaces, could be tested in parallel utilizing boundary-scan methodologies.

Figure 14:
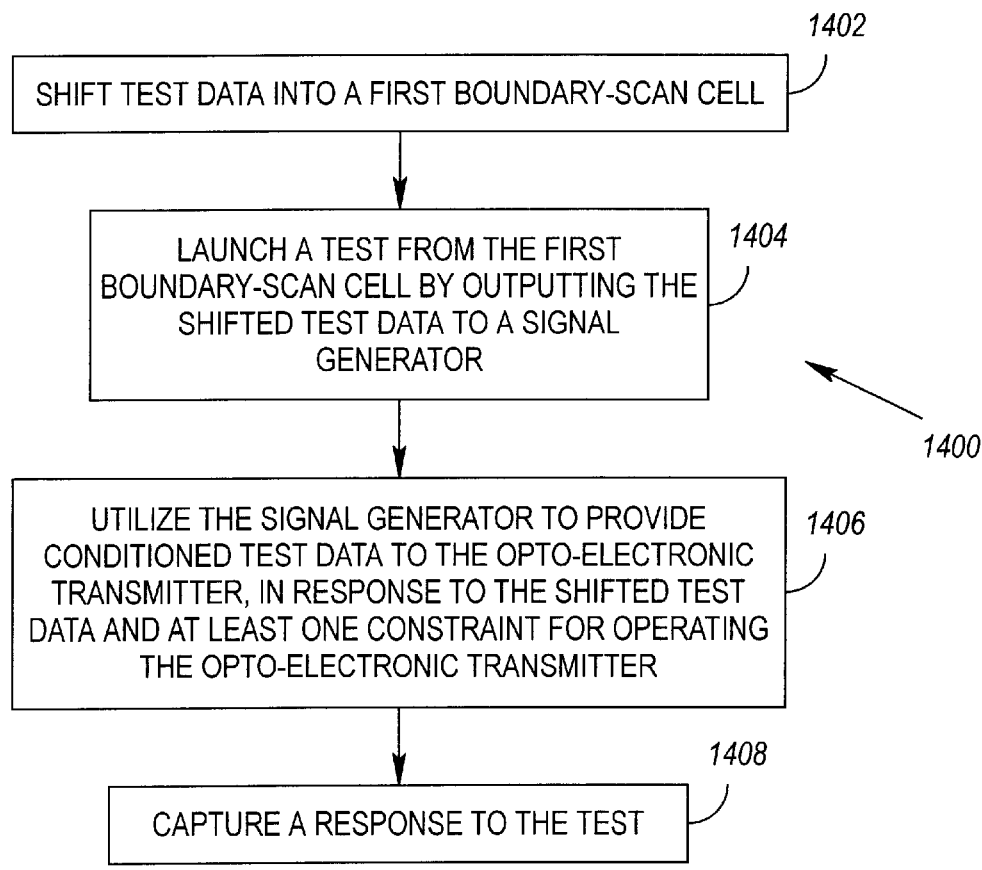
FIG. 14 illustrates a method for testing opto-electronic devices.

FIG. 14 illustrates a method 1400 for testing opto-electronic devices 302, 402. The method comprises 1) shifting 1402 test data into a first boundary-scan cell 500 (FIG. 5), 2) launching 1404 a test from the first boundary-scan cell 500, and 3) capturing 1408 a response to the test. The test is launched 1404 from the first boundary-scan cell 500 by outputting the shifted test data to a signal generator 502. The signal generator 502 then provides 1406 conditioned test data to an opto-electronic transmitter 302, in response to the shifted test data and at least one constraint for operating the opto-electronic transmitter 302.

The constraint(s) for operating the opto-electronic transmitter 302 may comprise an eye safety constraint. Although an eye safety constraint may be implemented in various ways, one way in which an eye safety constraint may be implemented is by controlling the steady-state power of an opto-electronic transmitter 302. An eye safety constraint may also be implemented by controlling total power, heat dissipated, etc.

Constraints for operating the opto-electronic transmitter 302 may also comprise constraints relating to heat dissipation, consecutive hours of transmitter use, and so on.

Constraints for operating the opto-electronic transmitter 302 may be variously embodied. For example, constraints may be embodied in hardware, software, firmware, or other means. Preferably, however, a constraint is embodied in at least one algorithm implemented in hardware.

Figure 9:
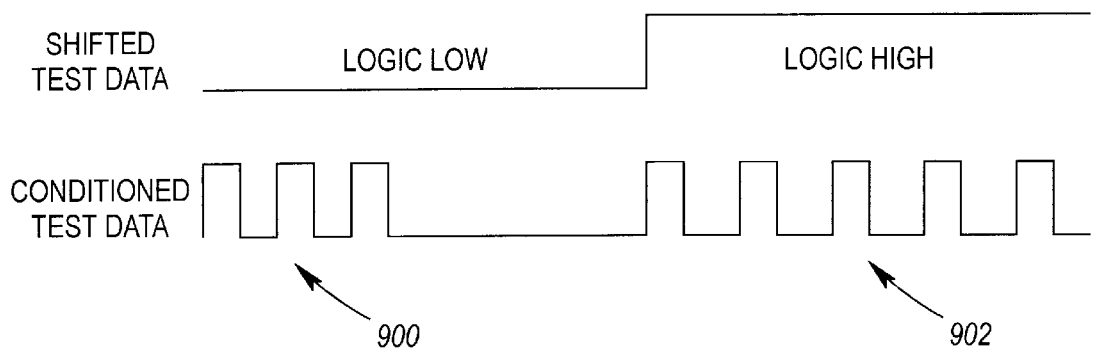
FIG. 9 illustrates a second number of waveforms that the FIG. 7 waveform generator might receive and generate.

In conformance with the constraints under which it operates, the signal generator 502 may provide conditioned test data to the opto-electronic transmitter 302 in a number of forms. In one form, some or all of the conditioned test data comprises a series of pulses. For example, in one embodiment, the signal generator's receipt of logic high test data causes the signal generator 502 to provide a series of pulses to the transmitter 302, and the signal generator's receipt of logic low test data causes the signal generator 502 to provide a logic low to the transmitter 302 (see, e.g., FIG. 8). In another embodiment, the signal generator's receipt of logic high test data causes the signal generator 502 to provide the transmitter 302 with a series of pulses having a first set of characteristics (e.g., a first frequency, duration, and/or duty cycle), and the signal generator's receipt of logic low test data causes the signal generator 502 to provide the transmitter 302 with series of pulses having a second set of characteristics (e.g., a second frequency, duration, and/or duty cycle; see, e.g., FIG. 9).

There are a number of ways to capture a response to a test. Preferably, the opto-electronic transmitter 302 sends a signal to an opto-electronic receiver 302. The receiver 402 then produces a response which is received into a signal detector 1002. The signal detector 1002, in turn, passes the response to a shift register element 404. The signal detector 1002 is not mandatory. However, it serves a variety of useful purposes. For example, the signal detector 1002 can capture a response received over a period of time. If the response is "fleeting", the signal detector 1002 may listen for the response over the period of time, and evaluate whether a response has in fact been received. If the response is long (e.g., a series of pulses), then the signal detector 1002 may integrate and evaluate the response before providing an indication of the response to the shift register element 404.

If necessary, the above-described method may comprise clearing the signal detector 1002. This is preferably done as a test is launched, by providing a common test control signal (e.g., UPDATE) to both the first boundary-cell and the signal detector. If IEEE Standard 1149.1 is being followed, the clear signal may be a signal that is pulsed in sync with the UPDATE_DR and/or UPDATE_IR states.

Although the opto-electronic receiver 402 could be coupled directly to the shift register element 404, the insertion of a signal detector 1002 is necessary in most cases due to the inability to time what could be a very short, very long, or pulsed response It should be noted that the FIG. 14 method may be performed as part of IEEE Standard 1149.1 EXTEST-based testing, thus leveraging standardized testing methodologies.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A system, comprising:
   a) an opto-electronic transmitter having an electrical input and an optical output; and
   b) a boundary-scan cell comprising a serial input and serial output that link the boundary-scan cell within a scan chain, and a signal generator; said signal generator comprising:
      i) a test input coupled to receive test data that is shifted-into said boundary-scan cell via said serial input;
      ii) a test output coupled to provide conditioned test data to said electrical input of said opto-electronic transmitter; and iii) logic, coupled between said test input and test output, for generating said conditioned test data in conformance with said shifted test data and at least one constraint for operating said opto-electronic transmitter.

2. A system as in claim 1, wherein said boundary-scan cell receives, and is controlled by, IEEE Standard 1149.1 boundary-scan signals.

3. A system as in claim 1, wherein:
   a) said logic comprises a waveform generator for producing rectangular waveforms; and
   b) at least some of said conditioned test data comprises said rectangular waveforms.

4. A system as in claim 3, wherein:
   a) said rectangular waveforms have a first set of characteristics when said shifted test data is a logic high; and
   b) said rectangular waveforms have a second set of characteristics when said test data is a logic low.

5. A system as in claim 3, wherein:
   a) said rectangular waveforms are produced when said shifted test data assumes a first logic level; and
   b) said waveform generator is disabled when said shifted test data assumes a second logic level.

6. A system as in claim 3, wherein:
   a) said constraint for operating said opto-electronic transmitter is a steady-state power constraint; and
   b) said waveform generator is configured to produce rectangular waveforms that cause said opto-electronic transmitter to conform to said steady-state power constraint.

7. A system as in claim 1, wherein said constraint for operating said opto-electronic transmitter is an eye safety constraint.

8. A system, comprising:
   a) an opto-electronic receiver having an optical input and an electrical output; and
   b) a boundary-scan cell comprising a serial input and serial output that link the boundary-scan cell, and a signal detector;
   said signal detector comprising:
      i) a test input coupled to receive a response from said electrical output of said opto-electronic receiver;
      ii) a test output coupled to provide an evaluated response to said serial output; and
      iii) logic, coupled between said test input and test output, for generating said evaluated response after monitoring said signal detector input over a period of time.

9. A system as in claim 8, wherein said boundary-scan cell receives, and is controlled by, IEEE Standard 1149.1 boundary-scan signals.

10. A system as in claim 8, wherein said logic comprises a set-reset flip-flop, said set-reset flip-flop comprising:
    a) a set input coupled to said test input; and
    b) a reset input coupled to receive at least one test control signal.

11. A system as in claim 8, wherein said signal detector further comprises a clear input coupled to receive at least one test control signal.

12. A system as in claim 8, wherein said logic comprises an integrator for integrating said response over said period of time.

13. A system as in claim 12, wherein:
    a) the integrator is configured to output a logic low when said response comprises a first series of pulses; and
    b) the integrator is configured to output a logic high when said response comprises a second series of pulses.

14. A method for testing opto-electronic devices, comprising:
    a) shifting test data into a first boundary-scan cell;
    b) launching a test from the first boundary-scan cell by outputting said test data to a signal generator; said signal generator providing conditioned test data to an opto-electronic transmitter in response to:
       i) said test data; and
       ii) at least one constraint for operating said opto-electronic transmitter; and
    c) capturing a response to said test.

15. A method as in claim 14, wherein the at least one constraint for operating said opto-electronic transmitter comprises an eye safety constraint of said opto-electronic transmitter.

16. A method as in claim 14, wherein the at least one constraint for operating said opto-electronic transmitter comprises a constraint for controlling steady the state power output of said opto-electronic transmitter.

17. A method as in claim 14, wherein the at least one constraint for operating said opto-electronic transmitter is embodied in at least one algorithm implemented in hardware.

18. A method as in claim 14, wherein the signal generator provides at least some of said conditioned test data to said opto-electronic transmitter as a series of pulses.

19. A method as in claim 18, wherein the signal generator:
    a) provides said conditioned test data to said opto-electronic transmitter as a series of pulses having a first set of characteristics when said test data is a logic high; and
    b) provides said conditioned test data to said opto-electronic transmitter as a series of pulses having a second set of characteristics when said test data is a logic low.

20. A method as in claim 14, wherein the signal generator:
    a) provides said conditioned test data to said opto-electronic transmitter as a series of pulses when said test data is a logic high; and
    b) provides a logic low to said opto-electronic transmitter when said test data is a logic low.

21. A method as in claim 14, wherein capturing said response comprises capturing said response at a second boundary-scan cell.

22. A method as in claim 21, wherein capturing said response at a second boundary-scan cell comprises integrating, over a period of time, a response received from an electrical output of an opto-electronic receiver.

23. A method as in claim 14, wherein:
    a) capturing said response comprises receiving said response into a signal detector; and
    b) the method further comprises clearing said signal detector as said test is launched.

24. A method as in claim 23, wherein launching the test and clearing said signal detector are performed, at least in part, by providing a common test control signal to said first boundary-scan cell and said signal detector.

25. A method as in claim 14, wherein said method is performed as part of IEEE Standard 1149.1 EXTEST-based testing.

* * * * *